(12) United States Patent
Yamada

(10) Patent No.: US 7,078,274 B2
(45) Date of Patent: Jul. 18, 2006

(54) METHOD OF FORMING ACTIVE MATRIX TYPE DISPLAY INCLUDING A METAL LAYER HAVING A LIGHT SHIELD FUNCTION

(75) Inventor: Tsutomu Yamada, Gifu (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 10/618,163

(22) Filed: Jul. 11, 2003

(65) Prior Publication Data

US 2004/0038501 A1 Feb. 26, 2004

Related U.S. Application Data

(63) Continuation of application No. 10/112,929, filed on Mar. 28, 2002, now Pat. No. 6,621,103.

(30) Foreign Application Priority Data

Mar. 30, 2001 (JP) .................................... 2001-102378

(51) Int. Cl.
H01L 21/00 (2006.01)
H01L 21/84 (2006.01)
H01L 21/20 (2006.01)
H01L 21/36 (2006.01)

(52) U.S. Cl. ................. 438/149; 438/151; 438/486; 438/487

(58) Field of Classification Search ............... 438/151, 438/30, 149, 486, 487; 117/9
See application file for complete search history.

(56) References Cited

U.S. PATENT DOCUMENTS

| | | | |
|---|---|---|---|
| 4,822,751 A | 4/1989 | Ishizu et al. ................ 438/164 |
| 5,686,980 A | 11/1997 | Hirayama et al. ........... 349/110 |
| 5,705,829 A | * 1/1998 | Miyanaga et al. ............ 257/66 |
| 5,771,110 A | 6/1998 | Hirano et al. ................. 257/72 |
| 5,917,225 A | 6/1999 | Yamazaki et al. ........... 257/411 |
| 6,133,074 A | * 10/2000 | Ishida et al. ................. 438/153 |
| 6,172,721 B1 | 1/2001 | Murade et al. ................ 349/43 |
| 6,236,063 B1 | 5/2001 | Yamazaki et al. ............. 257/59 |

(Continued)

FOREIGN PATENT DOCUMENTS

| | | |
|---|---|---|
| JP | 5-63172 | 3/1993 |
| JP | 10-261801 | 9/1998 |
| JP | 11084359 | 3/1999 |
| JP | 11265000 | 9/1999 |

OTHER PUBLICATIONS

Office Action for U.S. Appl. No. 10/353,646 dated Dec. 14, 2004.
Office Action for U.S. Appl. No. 10/353,557 dated Dec. 29, 2004.
First Examination Report of Chinese Patent Application Serial No. 03101972.2 dated Jan. 14, 2005.

(Continued)

*Primary Examiner*—William M. Brewster
(74) *Attorney, Agent, or Firm*—Cantor Colburn LLP

(57) ABSTRACT

In an active matrix type display having built-in drivers, a metal layer is formed over a portion of a transparent substrate and a buffer layer is provided over both the region where the metal layer is formed and over the region where the metal layer is not formed. Above the buffer layer, a first polycrystalline silicon film is provided over the region where the metal layer is formed and a second polycrystalline silicon film is provided over the region where the metal layer is not formed. A buffer layer with sufficient thickness and thermal capacity can provide sufficient distance between the active layers and the lower metal layer to alleviate thermal leakage caused by the metal layer. A first polycrystalline silicon film and a second polycrystalline film each having a proper grain size can be obtained through laser annealing applied under the same conditions on an amorphous silicon film formed over the buffer layer.

10 Claims, 8 Drawing Sheets

U.S. PATENT DOCUMENTS

| | | |
|---|---|---|
| 6,327,006 B1 | 12/2001 | Sato et al. ................... 349/44 |
| 6,452,241 B1 | 9/2002 | Fukata et al. ................ 257/435 |
| 6,525,787 B1 | 2/2003 | Sato ............................. 349/43 |
| 6,573,955 B1 * | 6/2003 | Murade ....................... 349/44 |
| 6,583,440 B1 | 6/2003 | Yasukawa ................... 257/99 |
| 6,583,472 B1 | 6/2003 | Shibata et al. .............. 257/350 |
| 6,590,229 B1 | 7/2003 | Yamazaki et al. ........... 297/71 |
| 2001/0000676 A1 | 5/2001 | Zhang et al. ................ 349/12 |
| 2002/0145683 A1 | 10/2002 | Murade et al. .............. 349/43 |
| 2003/0143377 A1 | 7/2003 | Sano et al. .................. 428/156 |

OTHER PUBLICATIONS

Notice to Submit Argument for Korean Patent Application Serial No. 10-2003-0005818 dated Feb. 1, 2005.

Copy of the Office Action for the corresponding Chinese Patent application No. 021049920 and its excerpt English translation.

Copy of the excerpt English translation of Japanese Patent Laid-Open Publication No. Hei 5-63172.

Copy of the excerpt English translation of Japanese Patent Laid-Open Publication No. Hei 10-261801.

Excerpts from Japanese Patent Laid-Open Publication No. Hei 11-265000.

Copy of Office Action dated Feb. 1, 2005 in related Korean Patent Application No. 10-2003-0005820, no translation.

JP 11084359: Mar. 26, 1999 Abstract only (1 pg.).

JP11265000: Sep. 28, 1999 Abstract only (1 pg.).

\* cited by examiner

METHOD OF FORMING ACTIVE MATRIX TYPE DISPLAY INCLUDING A METAL LAYER HAVING A LIGHT SHIELD FUNCTION

CROSS-REFERENCE TO RELATED APPLICATIONS

This application is a continuation application of U.S. patent application Ser. No. 10/112,929, filed on Mar. 28, 2002 now U.S. Pat. No. 6,621,103, which is herein incorporated by reference in its entirety.

BACKGROUND OF THE INVENTION

1. Field of the Invention

The present invention relates to a lower layer structure for a polycrystalline semiconductor layer, and in particular to a lower layer structure for a polycrystalline silicon active layer of a thin film transistor (hereinafter referred to as a "TFT") of an active matrix type display.

2. Description of the Related Art

Because the thickness, size, and weight of flat panel displays such as liquid crystal displays (hereinafter referred to as "LCDs") can be reduced and the flat panel displays have low power consumption, LCDs or the like are now widely used as displays for various devices such as, for example, portable information devices. LCDs having a thin film transistor or the like provided as a switching element in each pixel are called "active matrix" displays. Because display content for each pixel can be reliably maintained in such panels, active matrix displays are used for high resolution, high quality display applications.

FIG. 1 shows an equivalent circuit for a pixel in an active matrix type LCD. Each pixel comprises a thin film transistor (TFT) connected to a gate line GL and a data line DL. When the TFT is switched on by a selection signal output through the gate line, data corresponding to the display content is supplied from the data line through the TFT to a liquid crystal capacitor Clc. Also, because the written display data must be reliably maintained for the duration of the time from after the TFT is selected and data is written until the TFT is selected again, a storage capacitor Csc is connected to the TFT in parallel to the liquid crystal capacitor Clc.

In such an active matrix type LCD, a top gate type TFT in which a polycrystalline silicon (polysilicon) layer is used as an active layer and a gate electrode is formed above the active layer is a known type of TFT provided for each pixel. Because a top gate type polysilicon TFT is self-aligned and a source region, a drain region, and a channel region can be easily formed in the polysilicon active layer using its gate, this type of TFT is very advantageous for reducing the size of the TFT and for integration of TFTs.

Moreover, it is known that a polycrystalline silicon layer can be formed by laser annealing through low temperature processes which can polycrystallize an amorphous silicon film after such an amorphous silicon film is formed. The laser annealing can be employed also for forming a high-quality polycrystalline silicon layer on a glass substrate having a low melting point which is inexpensive as a substrate and in which a large area can easily be secured. Accordingly, currently, the laser annealing process is used for manufacturing polysilicon TFTs for active matrix type LCDs.

When such a TFT is used in, for example, a projector panel, in some cases, a metal layer may be formed below the TFT as a light shielding member for preventing light from a light source from entering the active layer of TFT. Moreover, when the TFT is used in a high resolution panel or the like, a metal layer is in some cases formed as a black matrix below the TFT and around the pixel electrode.

Although the laser annealing process as described above allows formation of polycrystalline silicon having superior properties, there is a problem in that the quality of the polycrystalline silicon films resulting from the laser irradiation significantly varies depending on the materials below the silicon layer.

In a top gate type TFT, no structure is required below the channel region of the active layer. Thus, the annealing conditions for the channel formation region of the TFT having a metal layer formed below the channel formation region as described above may differ from those for the channel formation region of the TFT provided on the same substrate but having no metal layer below the channel formation region, because of the thermal conductivity or the like of the metal layer. Therefore, even when identical laser outputs of equal strength are irradiated onto amorphous silicon film, the actual annealing conditions may differ significantly because of the different materials in the layers below the TFT active layer.

FIG. 2A is a diagram showing the relationship between the energy output of a laser and the grain size of the polycrystalline silicon obtained by the laser annealing process. As shown in FIG. 2A, although until a certain point the grain size increases as the supplied energy increases, after the supplied energy exceeds the energy value at which the maximum grain size can be obtained, the grain size rapidly decreases as the supplied energy further increases.

When a metal layer is present below the amorphous silicon film, the heat generated by the laser diffuses very rapidly due to the presence of the metal layer having a relatively high thermal conductivity. In contrast, if the lower layer is a glass substrate, for example, the heat tends to escape more slowly, and, thus, the amorphous silicon film can be heated for a sufficient amount of time. The relationship between the energy supplied by the laser and the grain size which can be obtained respectively for an amorphous silicon film over a glass substrate and for an amorphous silicon film over a metal layer are shown in FIG. 2B. As is clear from FIG. 2B, when the thermal conductivity significantly varies below the active layer and the laser annealing process is to be applied simultaneously, if the laser energy is set so that a large grain size can be obtained at the region where a metal layer is present as a lower layer, for example, the laser at the region where no metal layer is present as a lower layer would be overly irradiated, and, thus, the grain size would be very small.

On the other hand, if the conditions are set to obtain a proper grain size at the region where no metal layer is formed below, the grain size in the polycrystalline silicon film over the region where the metal layer is formed would not be sufficient. Therefore, when thermal conductivities of underlying layers differ significantly, it is very difficult to set the conditions for forming a polycrystalline silicon film having a large grain size in all regions.

SUMMARY OF THE INVENTION

Accordingly, one object of the present invention is to provide a structure for forming a polycrystalline semiconductor film which is used as an active layer of a top gate type TFT or the like, wherein the properties of the film are appropriate in all regions.

In order to achieve at least the object described above, according to the present invention, there is provided a semiconductor device comprising a metal layer formed over a portion of a transparent substrate; a polycrystalline semiconductor film formed above and at least partially overlapping the metal layer and polycrystallized by laser annealing; and a buffer layer provided between the metal layer and the polycrystalline semiconductor layer.

According to another aspect of the present invention, there is further provided a semiconductor device comprising a metal layer formed over a portion of a transparent substrate; a first polycrystalline semiconductor film formed above the metal layer to at least partially overlap the metal layer and a second polycrystalline semiconductor film formed above the region where the metal layer is not formed, the first and second polycrystalline semiconductor films polycrystallized by laser annealing; and a buffer layer provided below the first and second polycrystalline semiconductor film layers and above the metal layer.

According to the present invention, a buffer layer is provided below the semiconductor film which is polycrystallized through laser annealing. In the present invention, it is preferable that the buffer layer has a function to alleviate thermal leakage caused by thermal conduction in the metal layer, through, for example, sufficient thickness and thermal capacity. Thus, even when the material of the layer further below the buffer layer is, for example, a metal layer or a substrate such as glass and there is a significant difference in the thermal leakage for laser annealing, the difference in thermal leakage (escape) can be alleviated by the buffer layer so that the semiconductor films above the buffer layer can be crystallized to form a polycrystalline semiconductor film with proper characteristics.

According to another aspect of the present invention, it is preferable that, in the semiconductor device, the polycrystalline semiconductor film forms an active layer of a thin film transistor.

According to yet another aspect of the present invention, it is preferable that, in the semiconductor device, the buffer layer comprises a silicon oxide film formed at the side near the polycrystalline semiconductor film with a thickness of 200 nm or greater and a silicon nitride film formed at the side near the transparent substrate with a thickness of approximately 50 nm.

According to still another aspect of the present invention, it is preferable that, in the semiconductor device, the buffer layer comprises a silicon nitride film formed at the side near the transparent substrate with a thickness of 100 nm or greater and a silicon oxide film formed at the side near the contact surface with the polycrystalline semiconductor film with a thickness of 130 nm or greater.

Because the buffer layer as described above has a sufficiently large thermal capacity, and a large interlayer distance can be provided between the active layer and the lower layers, thermal leakage caused by the lower layers can be prevented irrespective of the material of the lower layers and heat necessary for annealing the semiconductor layer above can be maintained. Also, because the light transmittance properties of a silicon oxide film and a silicon nitride film are comparable to those of the glass substrate, any variation in the transmittance of the device substrate caused by the formation of the buffer layer will be small. By providing, below the polycrystalline semiconductor film such as, for example, a polycrystalline silicon film, a silicon oxide film which is a material similar to that of the polycrystalline semiconductor film, application of unnecessary stress to the polycrystalline semiconductor film and, consequently, unnecessary defects can be avoided. Moreover, by providing a fine silicon nitride film as the film at the side of the buffer layer near the substrate, it is possible to prevent, for example, in a case where a low melting point glass is used as the substrate, entry of impurities such as alkali ion from the glass substrate into the semiconductor film.

According to a still further aspect of the present invention, there is further provided an active matrix type display, comprising a pixel section and a driver section on the same substrate; wherein a plurality of pixels are placed in the pixel section, each pixel comprising a pixel thin film transistor and a display element; the driver section comprises a plurality of driver thin film transistors for outputting signals for driving each of the pixels in the pixel section; the pixel thin film transistor and the driver thin film transistors both are formed as top gate type transistors on the substrate using polycrystalline silicon as the active layer, the material for the polycrystalline silicon being identical; a buffer layer comprising a silicon oxide film and a silicon nitride film is formed below the polycrystalline silicon active layers of the pixel thin film transistor and the driver thin film transistors; and a metal layer is placed below the polycrystalline silicon active layer of the pixel thin film transistor, with the buffer layer in between.

According to another aspect of the present invention, it is preferable that in an active matrix type display, each of the pixels further comprises a storage capacitor with the first electrode electrically connected to the active layer of the pixel thin film transistor; and the second electrode of the storage capacitor is formed by the metal layer.

When a polycrystalline silicon is used for the active layer of a top gate type thin film transistor in an active matrix type display, in addition to the pixel thin film transistors, drivers for driving the pixel section can be formed on the same substrate, as described above. When this is done, a storage capacitor having sufficient size can be provided while efficiently saving space within a pixel by forming electrodes of a storage capacitor for maintaining display data for a predetermined duration of time under the active layer of the pixel thin film transistor. Also, a light shielding metal layer may in some cases be formed to prevent incident light.

On the other hand, because high speed operation is desired for the drivers, it is desirable that no conductive layer be formed in the drivers which constitutes a capacitance component with the active layer. Even in such a case, according to the present invention, a buffer layer is formed under the active layers of both transistors. Because the buffer layer alleviates the difference in thermal leakage caused by the thermal conduction in the material under the buffer layer, it is possible to form the polycrystalline silicon active layers of the pixel thin film transistors and the driver thin film transistors which are polycrystallized through the same laser annealing process at proper film quality.

According to the present invention, by forming a buffer layer having sufficient thickness and thermal capacity between a transparent substrate such as glass and a semiconductor film polycrystallized through laser annealing, the thermal leakage under the buffer layer can be alleviated, and polycrystalline semiconductor films of appropriate quality can be formed under using one set of annealing conditions, regardless of whether or not a metal layer such as an electrode and a black matrix is present in a lower layer.

DESCRIPTION OF THE PREFERRED EMBODIMENT

Figure 1:
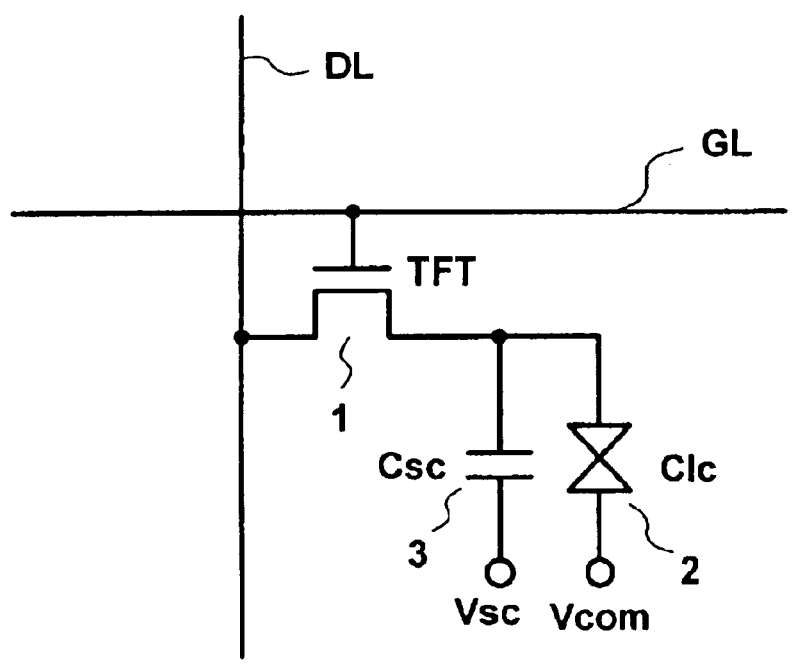
FIG. 1 is a diagram showing an equivalent circuit of a pixel in an active matrix type liquid crystal display.

The preferred embodiment of the present invention (hereinafter referred to simply as "the embodiment") will now be described referring to the drawings.
[Semiconductor Device]

Figure 3:
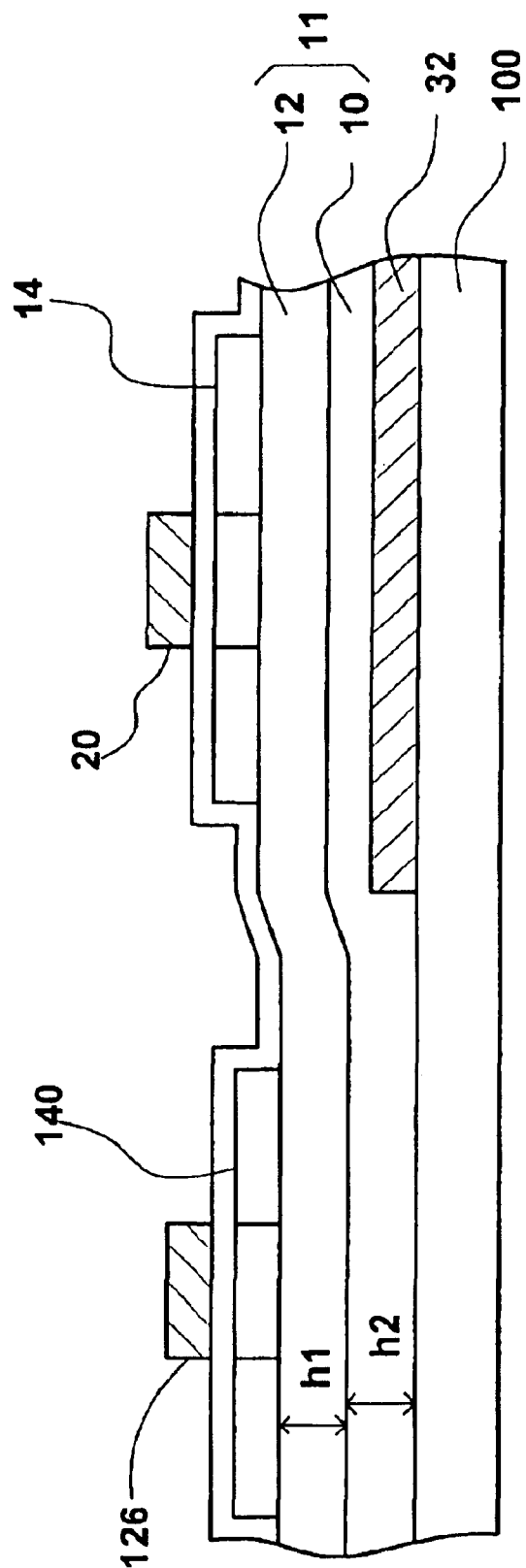
FIG. 3 is a diagram showing a structure of a semiconductor device according to the present invention.

FIG. 3 schematically shows a structure of a semiconductor device according to the embodiment. As shown in FIG. 3, in the semiconductor device, a metal layer 32 is selectively formed over a portion of a transparent substrate 100 such as glass and a buffer layer 11 is formed covering the metal layer and the entire substrate. The buffer layer 11 has a multi-layer structure of a silicon nitride film 10 and a silicon oxide film 12. In the region where the metal layer 32 is formed, a first polycrystalline silicon film 14 is formed on the buffer layer 11, and a first thin film transistor having the first polycrystalline silicon film 14 as the active layer is formed. In the region where the metal layer 32 is not formed, on the other hand, the buffer layer 11 is formed directly over the substrate 100 and a second polycrystalline silicon film 140 is formed on the buffer layer 11. A second thin film transistor having the second polycrystalline silicon film 140 as its active layer is further formed.

Here, the buffer layer 11 has a multi-layer structure with the silicon oxide film ($SiO_2$) 12 at the side near the first and second polycrystalline silicon films and the silicon nitride film (SiNx) 10 at the side near the substrate. Because the characteristics of the silicon oxide film closely match those of the silicon film, use of the silicon oxide film 12 at the side near the first and second polycrystalline silicon films makes it possible to prevent generation of stresses or the like at the film boundary, and to thereby prevent formation of defects in the silicon films. On the other hand, by forming a fine silicon nitride film 10 at the side near the substrate, even when a low melting point glass or the like is used as the substrate 100, entry of impurities (for example, Na ions when an alkali glass is used) from the glass into the silicon films can be prevented.

It is preferable that the buffer layer 11 sufficiently reduces the thermal leakage by the lower metal layer to a degree similar to that in the region above the glass substrate. In order to achieve this, it is possible to set each of the layers as in the following examples. When the thickness h2 of the silicon nitride film 10 is 50 nm, it is preferable to set the thickness h1 of the silicon oxide film 12 to 200 nm or greater. Alternatively, if the thickness h1 of the silicon oxide film 12 is 130 nm, it is preferable to set the thickness h2 of the silicon nitride film 10 to 100 nm or greater. The thicknesses of the two layers are not limited to the above values, and the material and thickness of the buffer layer 11 are not limited to the above values. It is preferable that the buffer layer 11 is formed with a thickness that increases the distance between the active layer and the metal layer and in which heat tends not to escape rapidly when laser is irradiated onto the active layer.

Figure 2A:
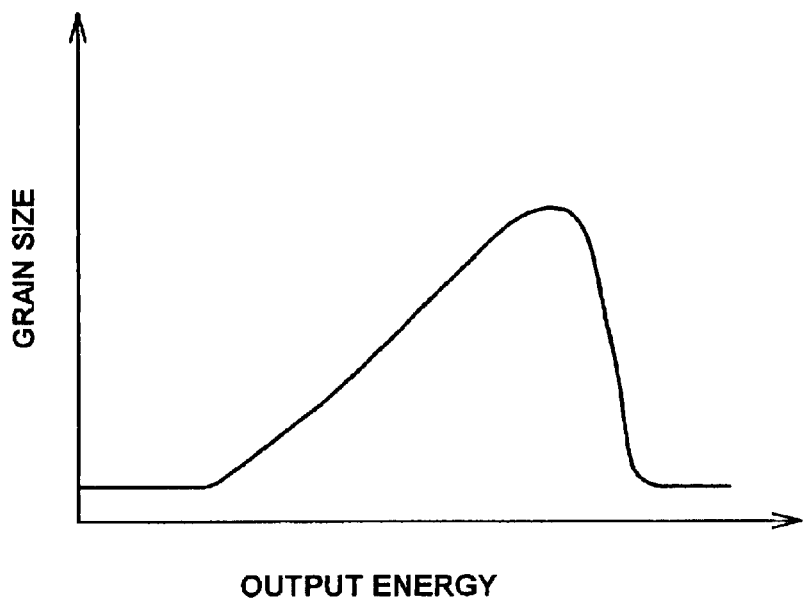
FIGS. 2A and 2B are diagrams showing the relationship between energy output during laser annealing and the grain size of polycrystalline silicon polycrystallized by the laser annealing process.
Figure 2B:
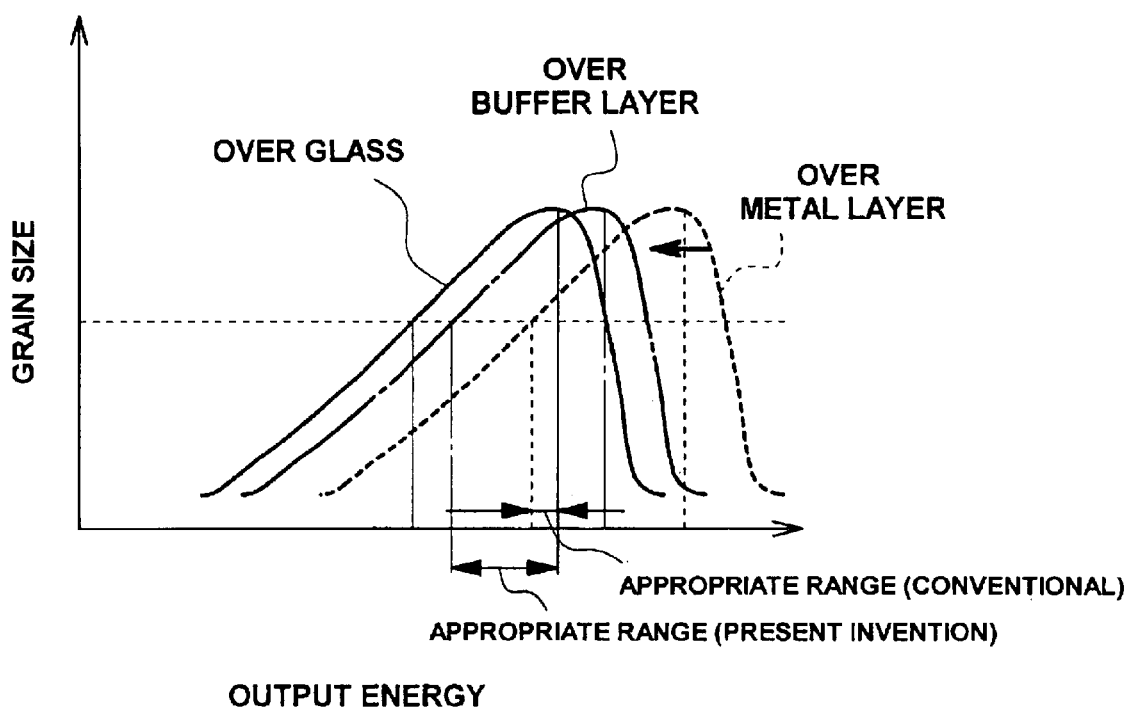

The buffer layer is formed under the first and second polycrystalline silicon films, as described above. Because of the presence of the buffer layer 11, a polycrystalline silicon film having desired grain sizes in both the region where the metal layer is formed and the region where the metal layer is not formed can be formed by first forming an amorphous silicon film on the buffer layer 11 and then irradiating laser (excimer laser) light of uniform intensity onto the film. That is, as shown in FIG. 2B, because the appropriate energy range for the region where the metal layer is formed is closer to the appropriate energy range for the region where the metal layer is not formed (refer to the graph labeled "over buffer layer" in FIG. 2B), the range of energies appropriate for both regions is widened. Therefore, polycrystalline silicon with proper grain sizes can be formed in both regions by laser annealing under uniform conditions.
[Active Matrix Type Display]

Figure 4:
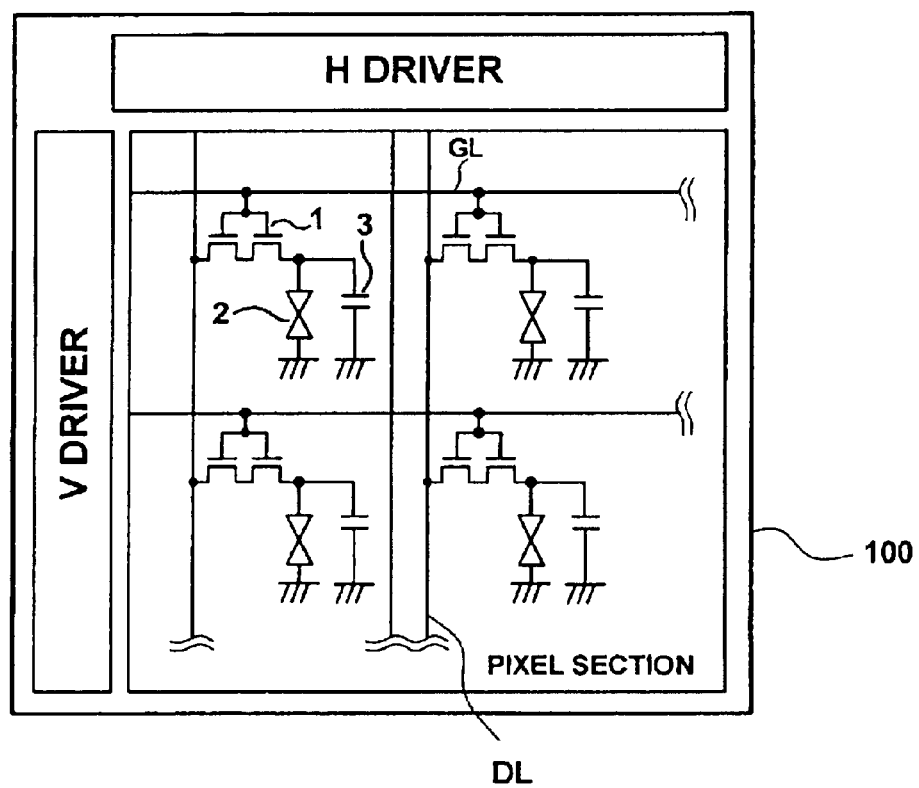
FIG. 4 is a schematic diagram showing the structure of an active matrix LCD having built-in drivers according to an embodiment of the present invention.

Next, the embodiment of the present invention will be described using an active matrix type display having a built-in driver as an example of the semiconductor device and a liquid crystal display (LCD) as an example of the display. An LCD is formed by a first substrate and a second substrate, both of which are made of a transparent insulative material such as glass, affixed together with liquid crystal in between. FIG. 4 conceptually shows a structure of such a display panel. The display panel comprises a pixel section provided on a first substrate (100) and drivers (H driver and V driver) for driving the pixel section, formed on the same substrate at the periphery of the pixel section. The pixel section comprises top gate type TFTs having a polycrystalline silicon active layer, and, similarly, the drivers comprise top gate type polycrystalline silicon TFTs. The circuit structure for each pixel is identical to that shown in FIG. 1. In the H driver and V driver, a p-channel polycrystalline silicon TFT and an n-channel polycrystalline silicon TFT are placed in, for example, a CMOS structure, as will be described later.

Figure 5:
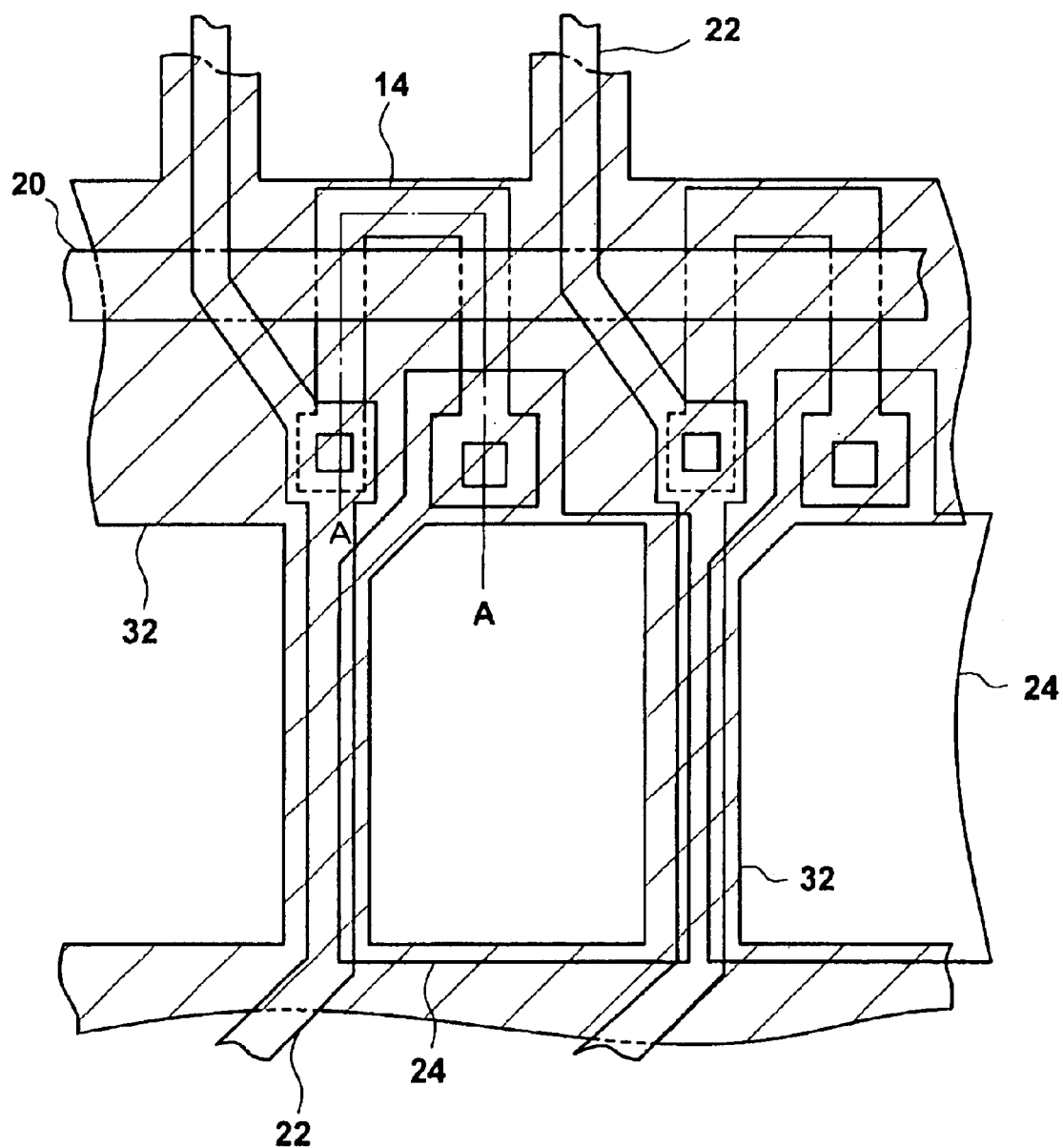
FIG. 5 is a schematic diagram showing the planer structure in each display pixel of the LCD shown in FIG. 4.
Figure 6:
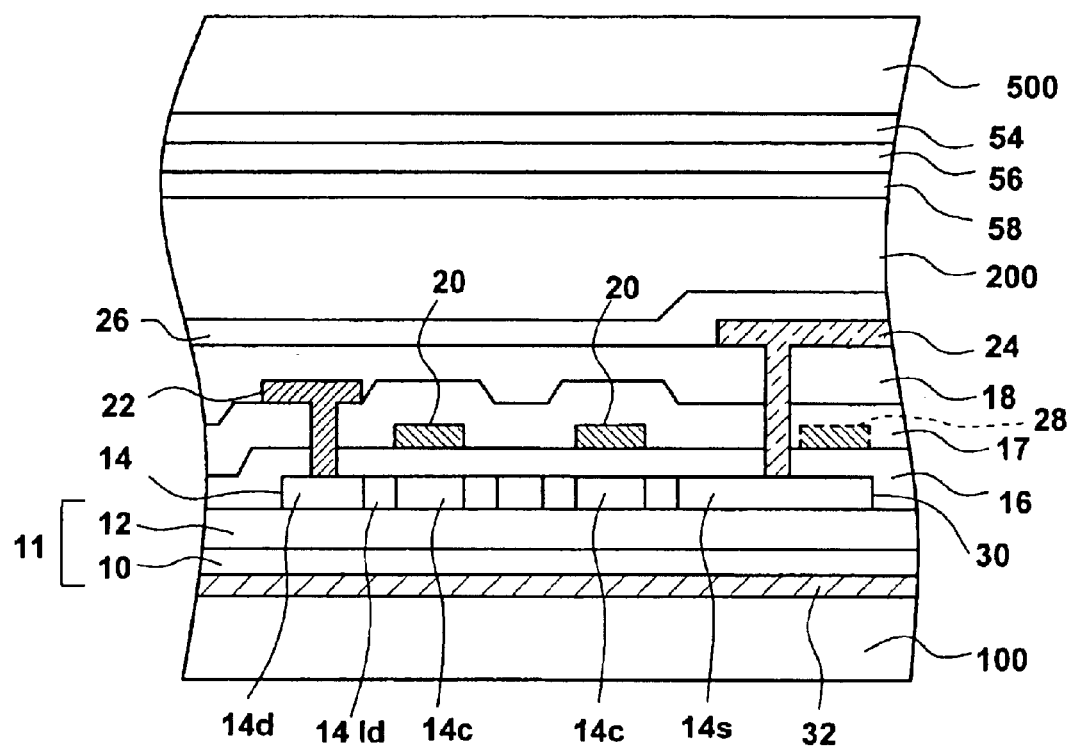
FIG. 6 is a schematic diagram showing the cross sectional structure of the LCD shown in FIG. 5 along line A—A.

First, the pixel section will be described. FIG. 5 shows a planer structure of a pixel section of the LCD according to the embodiment. FIG. 6 shows a schematic cross sectional view of the LCD along A—A line in FIG. 5.

As shown in FIGS. 4 and 5, in the pixel section on the first substrate 100, pixel electrodes 24 are arranged in a matrix and a top gate type TFT 1 and a storage capacitor 3 (Csc) are provided corresponding to each pixel electrode 24. In each pixel, the gate of the TFT 1 is connected to a gate line 20 extending in the row direction, the drain (or the source) is connected to a data line 22 extending in the column direction, and a liquid crystal capacitor 2 (Clc) and the storage capacitor (Csc) 3 are connected to the source (or drain) in parallel. The equivalent circuit of each pixel is similar to that shown in FIG. 1, but, in the example of the embodiment, a multi-gate type TFT is used as the TFT in each pixel, and therefore, a structure is employed in which the gate is common and a plurality of TFT active layers are electrically connected in series between the data line and the pixel electrodes. It is also possible to employ a structure similar to that shown in FIG. 1 in which a singular TFT is provided for each pixel.

As shown in FIG. 6, the liquid crystal capacity (display capacity) Clc connected to the source of the TFT 1 in each pixel is formed between a pixel electrode 24 onto which a voltage corresponding to the display content is applied and an opposing electrode (common electrode) 56 onto which a common potential Vcom is applied, the pixel and opposing electrodes being provided with the liquid crystal 200 in between.

The storage capacitor Csc is formed by arranging a first electrode 30 and a second electrode 32 to oppose each other with a buffer layer 11 (SiNx layer 10 and SiO$_2$ layer 12) between them. In addition, a third electrode 28 may be formed from the same layer as the gate electrode 20 above the first electrode 30 (active layer 14 of the TFT) sandwiching a gate insulative film 16, so that an additional storage capacitor may be formed by the first electrode and the third electrode 28. The first electrode 30 is common to the active layer 14 of the TFT 1. The second electrode 32 is formed on the first substrate 100 and extends below the active layer 14 with the buffer layer 11 in between. A voltage corresponding to the display content and supplied from the data line 22 via the TFT 1 is applied to the first electrode 30. A storage capacitor voltage Vsc which is common, for example, in the display region is applied to the second electrode 32.

The material for the second electrode 32 of the storage capacitor Csc may be a transparent conductive material such as an ITO, but in the example of the embodiment, the second electrode 32 is formed from a light shielding metal material. By using a light shielding material, the second electrode 32 can also function as a black matrix, thereby preventing light incident from the side of the first substrate from reaching the active layer 14 of the TFT 1, reducing the light leakage current of the TFT, and allowing for further improvement in the display contrast, in a top gate type TFT 1. In some cases, the metal layer formed below the active layer 14 (below the buffer layer 11) may be, for example, black matrix for shielding light for the active layer 14 and other wiring rather than the second electrode of the storage capacitor as described above. As described above, it is further possible that the second electrode 32 functions also as a black matrix.

As described, according to the embodiment, in the pixel section, the second electrode 32 which is made of a metal material is formed on the glass substrate 100, the buffer layer 11 is formed over the second electrode 32, and the active layer 14 of the pixel TFT 1 is formed on the buffer layer 11 to overlap the region where the second electrode 32 is formed.

The active layer 14 is made of a polycrystalline silicon film, which is polycrystallized by laser annealing in which low temperature processes are possible.

A gate insulative film 16 is formed over the active layer 14 and a gate electrode 20 is further formed on the gate insulative film 16. An interlayer insulative film 17 is formed on and covering the gate electrode 20. A contact hole is formed to penetrate through the interlayer insulative film 17 and the gate insulative film 16 and a drain electrode 22 which is integral with the data line is connected through the contact hole to the drain region 14d of the pixel TFT 1. Further, a planarization insulative layer 18 is formed to cover the data line (drain electrode 22). A contact hole is formed to penetrate through the planarization insulative layer 18, interlayer insulative film 17, and gate insulative film 16 and a transparent pixel electrode 24 made of ITO or the like is connected through the contact hole to the source region 14s of the TFT 1. In addition to the direct contact shown in FIG. 6, the connection between the pixel electrode 24 and the source region 14s (or drain region 14b) may be formed via the source electrode (or drain electrode). In addition, an orientation film 26 for controlling the alignment of the liquid crystals is formed to cover the pixel electrode 24.

The second substrate which is arranged to oppose the first substrate having the structure thus described with the liquid crystal 200 in between is formed by forming a color filter layer 54 and a common transparent electrode 56 on a transparent substrate 500. An orientation film 58 similar to that on the first substrate is formed at the boundary with the liquid crystal.

An example structure of the built-in drivers formed at the periphery of the pixel section for driving the pixel section will now be described referring to FIG. 7. The elements that have already been described above will be assigned the same reference numerals and will not be described again. In the cross sectional diagram of FIG. 7, a p-ch type TFT and an n-ch type TFT are shown which form a CMOS structure of the driver. Similar to the pixel TFT, the active layer 140p and 140n of the TFTs are both formed of a polycrystalline silicon film obtained by crystallizing amorphous silicon through laser annealing. Also, a gate insulative film 16 is formed over the active layers 140p and 140n, and respective gate electrodes 126 are formed on the gate insulative film 16. An interlayer insulative film 17 is formed on and covering the gate electrodes 126. Contact holes are formed to penetrate through the interlayer insulative film 17 and the gate insulative film 16. A source electrode 124 is connected to the respective sources of the p-ch and n-ch TFTs and drain electrodes 122 are connected respectively to the drains of the p-ch TFT and of the n-ch TFT.

Figure 7:
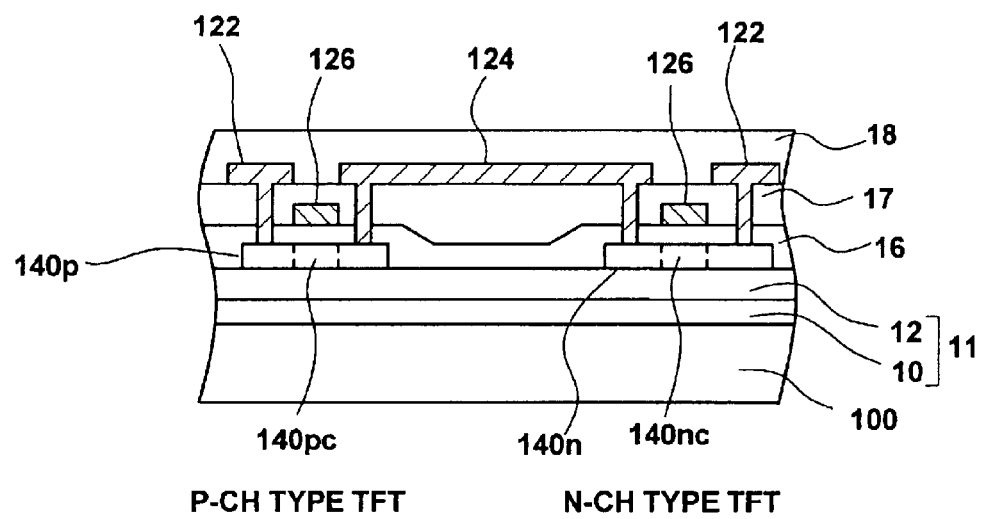
FIG. 7 is a diagram showing an example cross sectional structure of TFTs in the built-in drivers of the LCD shown in FIG. 4.

As shown in FIG. 7, in the embodiment, no metal layer is present between the active layer 140 which is formed from the same material as the active layer of the pixel TFT and the substrate 100, but a buffer layer 11 similar to that in the pixel section is formed.

A method for manufacturing an LCD according to the embodiment will now be described.

As the first substrate 100, a transparent insulative substrate made from a material such as glass, quartz, or sapphire can be used. In the present embodiment, a low melting point glass substrate is used. First, a high melting point metal layer such as Cr is formed on the first substrate 100 made of the low melting point glass substrate. Then, by opening the portion corresponding to the regions where the pixel electrodes are to be formed, the second electrode 32 of the storage capacitor having the pattern as shown in FIG. 5 is formed. Next, through a process such as CVD, a buffer layer 11 which is a laminated structure of a silicon nitride film 10 and a silicon oxide film 12 is formed entirely over the substrate covering the second electrode 32, that is, over both the region where the electrode is formed and the region where the electrode is not formed.

Then, an amorphous silicon film is formed on the buffer layer 11 and an excimer laser is irradiated onto the amorphous silicon film from above to anneal and polycrystallize the amorphous silicon film. In the embodiment, as described above, during the excimer laser annealing, the buffer layer 11 having relatively large thermal capacity and thickness is present entirely below the amorphous silicon layer. Therefore, a polycrystalline silicon film having appropriate grain size can be formed both in the drivers and in the pixel section where a metal layer (second electrode 32) having a high thermal conductivity is formed further below the buffer layer 11 under the same laser annealing conditions.

After the polycrystallization annealing process is completed, the obtained polycrystalline silicon layer is patterned into the shape of the active layers of the pixel TFT and of the driver TFT, and into the shape of the first electrode of the storage capacitor. Further, a gate insulative film 16 made of SiO$_2$ is formed to cover the polycrystalline silicon layer.

After the gate insulative film 16 is formed, the gate electrodes 126 of the driver TFTs are formed by forming and patterning a metal layer using, for example, Cr. At the same time, in the pixel section, the gate line 20 which is integral with the gate electrode may be formed. This gate for the pixel TFT, however, can alternatively be formed using, for example, A1, in processes separate from those for the gate line 20.

Then, impurities are doped from the side of the gate into the active layers 14 and 140 using the gate as a mask. In the pixel TFTs, an impurity (such as phosphorus) is first doped into the active layer 14 with the gate as the mask at a low concentration. Then, the gate line 20 is covered by a mask having a width which is wider than the line width of the gate line 20 by a predetermined amount and an impurity (such as phosphorus) is doped into the active layer 14 at a high concentration. In this manner, in the active layer 14, an intrinsic channel region 14c in which no impurity is doped is formed in the region corresponding to the gate line 20, LD regions 141d, in which the impurity is doped at a low concentration, are formed adjacent to and at both sides of the channel region 14c, and a drain region 14d and a source region 14s, in which the impurity is injected in high concentration, are formed outside the LD region.

In the driver TFTs, the TFT having the same conductivity type as the pixel electrode, for example, the n-ch type TFT, can be doped simultaneously with the doping process for the active layer of the pixel TFTs. During this process, the region where the p-ch type TFT is to be formed is covered by a doping mask. After the doping of the active layer 140n of the n-ch type TFT is completed, the doping mask covering the p-ch type TFT formation region is removed. Then, the n-ch type TFT of the driver and the pixel TFT regions are covered and the active layer 140p is doped with an impurity such as boron.

After the doping process is completed, the doped impurities are activated through annealing. Then, an interlayer insulative film 17 is formed entirely on the structure and contact holes are formed penetrating through the interlayer insulative film 17 and the gate insulative film 16 at the region corresponding to the drain region 14d (or source region 14s; in the embodiment, the drain region 14d) of the TFT 1 in the pixel section and regions corresponding to the drain region and the source region of each TFT in the drivers. Further, in the pixel section, a data line 22 which also functions as the drain electrode is formed using A1 or the like, and is connected to the drain region 14d of the active layer 14 through the contact hole. Simultaneously, in the drivers, the drain and source electrodes are formed using A1 or the like and are respectively connected to the drain region and the source region of the TFTs through the contact holes. It is also possible to form the interlayer insulative film 17 directly after the completion of the doping process and then anneal the structure for activation of the impurities and hydrogenation to the polycrystalline silicon (active layer).

After necessary wiring is formed, a planarization insulative film 18 made of a resin or the like is formed entirely over the substrate, and a contact hole is formed at a position corresponding to the source region 14s of the TFT 1, penetrating through the planarization insulative film 18, interlayer insulative film 17, and gate insulative film 16. A transparent conductive material layer made of a material such as ITO is formed and patterned into the pixel electrode shape, to thereby form a pixel electrode 24 connected to the source region 14s through the contact hole.

After the pixel electrode 24 is formed, an orientation film 26 for controlling the alignment of the liquid crystal is formed as necessary over the entire surface. Through the above steps, the necessary elements are formed on the first substrate.

For a color display, color filters 54 such as R, G, and B are formed on a second substrate 500 made of a transparent substrate such as glass, plastic, or the like. An opposing electrode (common electrode) 56 made of ITO or the like for applying a voltage to the liquid crystals 200 along with each of the pixel electrodes 24 of the first substrate 100 is provided over the color filters 54. Similar to the first substrate 100, an orientation film 58 is formed on the opposing electrode 56.

The first substrate 100 and the second substrate 500 obtained through the above processes are affixed to each other along their respective outer peripheries with a predetermined gap between them. Liquid crystal 200 is injected into the gap between the substrates, and the LCD is completed. A polarization film, a phase difference film, etc. may be provided at the external side (in FIG. 6, at the side of the upper surface) of the second substrate 500.

In the active matrix type display according to the embodiment, by providing the second electrode of the storage capacitor below the active layer of the top gate TFT in each pixel as described above, it is possible to form the storage capacitor overlapping the region where the TFT is formed, and which therefore normally does not contribute to display in a transmission type display. As a result, the aperture of the pixels can be improved.

On the other hand, in the driver TFTs in which high speed operation is desired, essentially, there is no need for providing a capacitor component below the active layer. Therefore, in the embodiment, no metal layer is formed below the active layer of the driver TFTs. As described in the embodiment, the second electrode 32 is formed below the active layer 14 of the pixel TFT, but not below the active layer 140 of the driver TFTs. However, in both regions, the buffer layer 11 is provided directly below the active layers 14 and 140 in order to alleviate the difference in the thermal leakage caused by the structural difference below the active layers in the pixel section and in the drivers. Therefore, it is possible to obtain polycrystalline silicon having appropriate grain sizes at both the pixel section and the drivers using a laser annealing process employing a single set of annealing conditions.

When a polycrystallization laser annealing process is applied at the pixel section and at the drivers using the same annealing conditions, the grain size is within an appropriate range in both regions. The grain size of the polycrystalline silicon in the driver TFTs, however, is larger than the grain size of the polycrystalline silicon in the pixel TFTs.

This is thought to occur because the thermal diffusion is slightly faster in the pixels due to the second electrode 32 below the buffer layer 11. In an active matrix type display having a built-in driver, high speed operation of the TFTs in the pixels is not as urgent a requirement as for the driver TFTs, but, in the pixel TFTs, the leak current is preferably small so that the display data can be maintained. On the other hand, for the driver TFTs, high speed operation is strongly desired. Among the TFTs which use polycrystalline silicon polycrystallized by laser annealing, TFTs having larger grain size have smaller channel resistance, and, thus, are more suited for high speed operation. On the other hand, TFTs having smaller grain size have a relatively small off current. Therefore, by applying one type of laser annealing process, the polycrystalline silicon film can be selectively formed for pixels and drivers with grain sizes automatically distinguished to suit the desired characteristics of each TFT, allowing for efficient formation of high quality products.

Figure 8:
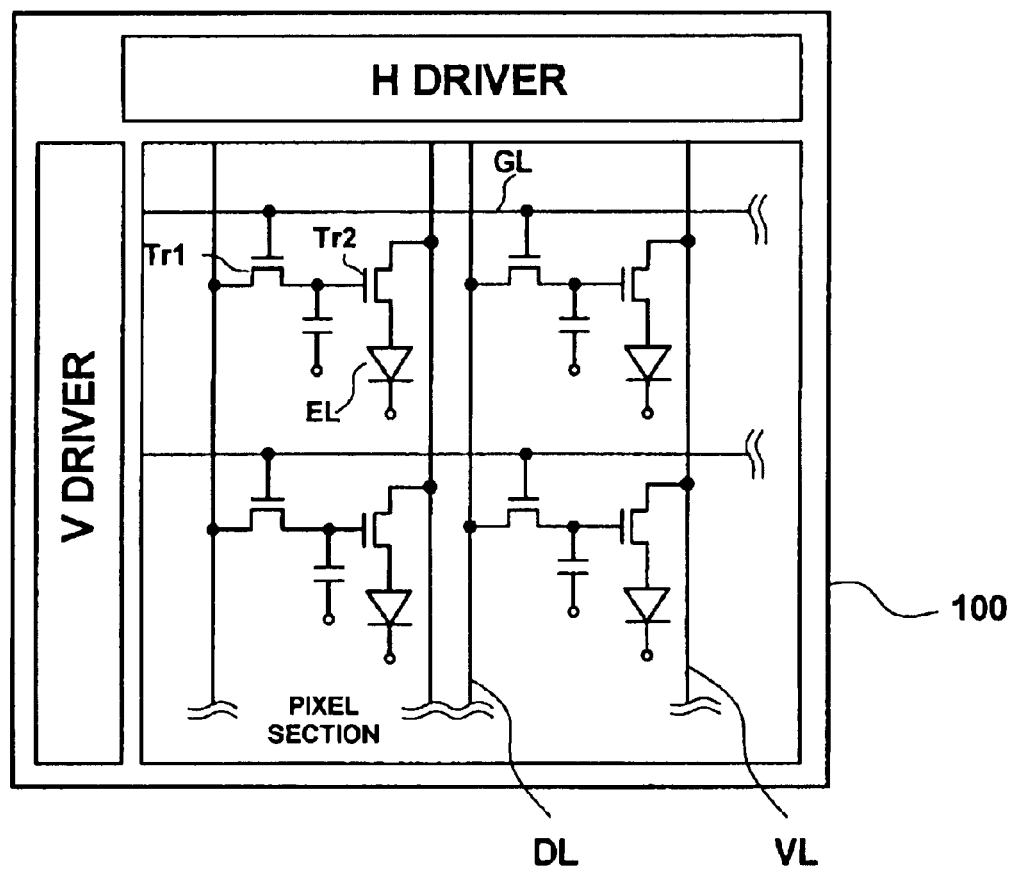
FIG. 8 is a diagram schematically showing an active matrix EL display having built-in drivers according to an embodiment of the present invention.

In the above description of the embodiment, an LCD is used as an example of an active matrix type display, but the present invention can be applied to any other active matrix type display which comprises a thin film transistor for each pixel and uses a similar thin film transistor at the periphery of the pixel section, such, as a driver, and similar advantages can be obtained. For example, the present invention can be applied to an active matrix type electroluminescence (EL) display as shown in FIG. 8. In the EL display shown in FIG. 8, for example, the TFT regions of H and V drivers may have only a buffer layer 11 and no metal layer as shown in FIGS. 3 and 7, and the TFT (Tr1 and Tr2) regions in each pixel may have both the buffer layer 11 and metal layer 32 as shown in FIGS. 3, 5, and 6. The EL element may have a structure, for example, in which an organic emissive element layer is formed on an ITO electrode 24 (anode), and a metal electrode (cathode) opposing the electrode 24 is formed on the organic emissive element layer. In FIG. 8, the line VL is a power supply line for supplying electric current to the EL element via the TFT Tr2.

What is claimed is:

1. A method for manufacturing a semiconductor device, comprising the steps of:

forming a metal layer over a partial region of a transparent substrate;

forming a buffer layer over almost the entire surface of the transparent substrate covering the metal layer in an order of a silicon nitride film and a silicon oxide film;

forming a first amorphous semiconductor film above the buffer layer such that the first amorphous semiconductor film at least partially overlaps the formation region of the metal layer with the buffer layer therebetween so that the metal layer overlaps regions in which a source, a channel, and a drain of a thin film transistor are to be formed in a first region of the first amorphous semiconductor and simultaneously forming a second amorphous semiconductor film above the non-formation region of the metal layer;

polycrystallizing the first and second amorphous semiconductor films through laser annealing to form a first polycrystalline semiconductor film and a second polycrystalline semiconductor film; and wherein the buffer layer alleviates thermal leakage caused by thermal conduction in the metal layer during polycrystallization of the first and second amorphous semiconductor films through laser annealing; and wherein the metal layer has a light shielding function for blocking light from a side near the metal layer to the thin film transistor to be formed.

2. A method for manufacturing a semiconductor device according to claim 1, wherein the buffer layer is obtained by forming a silicon nitride film having a thickness of approximately 50 nm at the side near the transparent substrate and forming a silicon oxide film having a thickness of 200 nm or greater at the side near the first and second polycrystalline semiconductor films.

3. A method for manufacturing a semiconductor device according to claim 1, wherein the buffer layer is obtained by forming a silicon nitride film having a thickness of 100 mm or greater at the side near the transparent substrate and forming a silicon oxide film having a thickness of 130 nm or greater at the side near a contact surface with the first and second polycrystalline semiconductor films.

4. A method for manufacturing a semiconductor device according to claim 1, wherein each of the first and second polycrystalline semiconductor films forms an active layer of a thin film transistor.

5. A method for manufacturing an active matrix display device wherein the active matrix display device comprises a pixel portion and a driver portion formed on a same substrate, the pixel portion having a plurality of pixels each comprising a pixel thin film transistor and a display element and the driver portion having a plurality of driver thin film transistors for outputting a signal for driving each pixel in the pixel portion, the method comprising the steps of:

selectively forming a metal layer above the substrate such that the metal layer is not formed over the formation region of the driver thin film transistor in the driver portion and is present over the formation region of the pixel thin film transistor in the pixel portion, overlapping at least regions in which a source, a channel, and a drain of the pixel thin film transistor are formed;

forming, as a buffer layer, a silicon nitride film and a silicon oxide film in that order over almost the entire surface of the substrate and covering the metal layer;

forming an amorphous semiconductor film over the buffer layer above the formation region of the pixel thin film transistor and above the formation region of the driver thin film transistor;

polycrystallizing, in a state wherein the buffer layer and the metal layer are present below the amorphous semiconductor film in the formation region of the pixel thin film transistor and the buffer layer is present below the amorphous semiconductor film in the formation region of the driver thin film transistor, the amorphous semiconductor film by irradiating laser onto the amorphous semiconductor film in a same laser annealing step;

forming a gate electrode above the obtained polycrystalline semiconductor film with a gate insulation film therebetween to obtain a pixel thin film transistor and a driver thin film transistor each having, as an active layer, the polycrystalline semiconductor film obtained respectively in the formation region of the pixel thin film transistor and the formation region of the driver thin film transistor; and wherein the buffer layer alleviates thermal leakage caused by thermal conduction in the metal layer during polycrystallization of the first and second amorphous semiconductor films through laser annealing; and wherein the metal layer has a light shielding function to block light from a side near the metal layer to the pixel thin film transistor to be formed.

6. A method for manufacturing an active matrix display device according to claim 5, wherein each pixel further comprises a storage capacitor which has a first electrode electrically connected to the active layer of the pixel thin film transistor, and a second electrode of the storage capacitor is formed by the metal layer.

7. A method for manufacturing a semiconductor device, comprising the steps of:

forming a metal layer over a partial region of a transparent substrate;

forming a buffer layer over almost the entire surface of the transparent substrate covering the metal layer;

forming a first amorphous semiconductor film above the buffer layer such that the first amorphous semiconductor film at least partially overlaps the formation region of the metal layer with the buffer layer therebetween and simultaneously forming a second amorphous semiconductor film above the non-formation region of the metal layer;

polycrystallizing the first and second amorphous semiconductor films through laser annealing to form a first polycrystalline semiconductor film and a second polycrystalline semiconductor film; and wherein the buffer layer alleviates thermal leakage caused by thermal conduction in the metal layer during polycrystallization of the first and second amorphous semiconductor films through laser annealing;

wherein the first polycrystalline semiconductor film and the second polycrystalline semiconductor film each comprise a grain size within an appropriate range, and wherein the grain size is formed during the laser annealing of the first and the second amorphous semiconductor films; and wherein the buffer layer has a layered structure of a silicon nitride film and a silicon oxide film, wherein the silicon oxide film is disposed over the silicon nitride film.

8. A method for manufacturing a semiconductor device according to claim 7, wherein the first polycrystalline semiconductor film and the second polycrystalline semiconductor film comprise grain sizes within an appropriate range and different from each other, wherein the grain sizes are formed during the laser annealing of the first amorphous semiconductor film and the second amorphous semiconductor film.

9. A method for manufacturing an active matrix display device wherein the active matrix display device comprises a pixel portion and a driver portion formed on a same substrate, the pixel portion having a plurality of pixels each comprising a pixel thin film transistor and a display element and the driver portion having a plurality of driver thin film transistors for outputting a signal for driving each pixel in the pixel portion, the method comprising the steps of:

selectively forming a metal layer above the substrate such that the metal layer is not formed over the formation region of the driver thin film transistor and is present over the formation region of the pixel thin film transistor;

forming, as a buffer layer, a silicon nitride film and a silicon oxide film in that order over almost the entire surface of the substrate and covering the metal layer;

forming an amorphous semiconductor film over the buffer layer above the formation region of the pixel thin film transistor and above the formation region of the driver thin film transistor;

polycrystallizing, in a state wherein the buffer layer and the metal layer are present below the amorphous semiconductor film in the formation region of the pixel thin film transistor and the buffer layer is present below the amorphous semiconductor film in the formation region of the driver thin film transistor, the amorphous semiconductor film by irradiating laser onto the amorphous semiconductor film in a same laser annealing step;

forming a gate electrode above the obtained polycrystalline semiconductor film with a gate insulation film therebetween to obtain a pixel thin film transistor and a driver thin film transistor each having, as an active layer, the polycrystalline semiconductor film obtained respectively in the formation region of the pixel thin film transistor and the formation region of the driver thin film transistor; and wherein the buffer layer alleviates thermal leakage caused by thermal conduction in the metal layer during polycrystallization of the first and second amorphous semiconductor films through laser annealing; and wherein the obtained polycrystalline semiconductor films each comprise a grain size within an appropriate range in each of the formation region of the pixel thin film transistor and the formation region of the driver thin film transistor.

10. A method for manufacturing an active matrix display device according to claim 7, wherein the obtained polycrystalline semiconductor films comprise grain sizes within an appropriate range and different from each other in each of the formation region of the pixel thin film transistor and the formation region of the driver thin film transistor.

* * * * *